April 16, 1968 J. P. KIMMETT 3,377,689
APPARATUS FOR REMOVING ELECTRICAL COMPONENTS
FROM A CIRCUIT BOARD
Filed Sept. 30, 1965

INVENTOR:
JAMES P. KIMMETT.
BY
Owen & Owen
ATT'YS.

United States Patent Office 3,377,689
Patented Apr. 16, 1968

3,377,689
APPARATUS FOR REMOVING ELECTRICAL COMPONENTS FROM A CIRCUIT BOARD
James P. Kimmett, 703 Pierce St., Delphos, Ohio 45833
Filed Sept. 30, 1965, Ser. No. 491,692
5 Claims. (Cl. 29—203)

ABSTRACT OF THE DISCLOSURE

A tool to be used by electronic technicians in removing small components from an electrical circuit board. The device consists of a platform supported by a plurality of legs adapted to be placed upon the circuit board. A releasable clamp for attachment to the component being removed is suspended from the platform above the component. When the clamp is attached to the component, resilient springs urge the clamp away from the circuit board so that the component will be pulled away once it is unsoldered or otherwise detached therefrom.

This invention relates to an apparatus which may be used by electronic technicians in the repair and/or maintenance of electronic equipment, particularly miniaturized or sub-miniature circuit boards. More specifically, this invention relates to an apparatus for assisting electronic repairmen in removing soldered components from electronic circuit boards which, as will be subsequently explained, may be positioned on one side of a circuit board attached to an electrical component or unit and will automatically pull such unit away from the board when the unit has been released, as by unsoldering, from the other side of the board by the worker.

Miniaturized or sub-miniature transistorized electrical circuit boards having a large number of components mounted on one side with the leads from such components extending through the board or soldered to one another are difficult to service due to the small working space available and the lack of access to the unit or component when the serviceman must perform soldering, etc. on the other side of the board.

On large installations, it may be impossible for a single worker to grasp the component on one side of the board and unsolder the component leads from the other side of the board with a manual soldering iron, due to the physical size of the circuit board. In other cases, due to the crowded nature of the components on the circuit board, it may be awkward or even impossible for a single worker to manipulate the board and the component to be removed while unsoldering its leads from the other side of the board.

A number of tools for assisting electronic repairmen in removal of mechanically attached or crimped components from a circuit board have been developed. These tools, such as those disclosed in U.S. Patents 2,906,013; 3,045,336; and 3,144,707 can be used satisfactorily when the serviceman or worker has one hand free to exert force or manipulate the tool to remove the component. While such tools are satisfactory for the removal of mechanically fastened or crimped components from circuit boards, none of them is readily adaptable for the removal of any one of a number of various sized components which are held to one side of the circuit board only by a solder joint which connects the leads of each component to the leads of other components on the board. In many cases, the leads of the various components extend through apertures in the board and are soldered on the other side thereof, making selection, gripping and removal of a particular component particularly difficult, especially in the case of large circuit boards, as previously explained.

Accordingly, it is an object of this invention to provide a simple tool for use in removing selected components from the circuit board, which tool, when placed in position over the component to be removed and attached to the component, will automatically pull or urge the component away from the circuit board and will thus remove the component when its leads are unsoldered or otherwise released from the circuit board.

Another object of this invention is to provide a tool for use in removing components from a circuit board, which, when positioned upon a circuit board over a component to be removed and when attached to the component, will automatically urge, by means of the force of a mechanical spring, such component away from the board so that it will be removed therefrom when the leads of the component are unsoldered or otherwise released from the board by the worker.

It is yet another object of this invention to provide an electronic service tool for the removal of components from the circuit board which is adapted to be used with a large number of various sized components and which may be quickly and easily positioned and placed over such components and which provides means for adjusting the force which is used to remove the component from the circuit board.

Other objects and advantages of the invention will be apparent from the following detailed description thereof, reference being made to the accompanying drawings in which.

Figures 1, 2, 3, 4, 5:
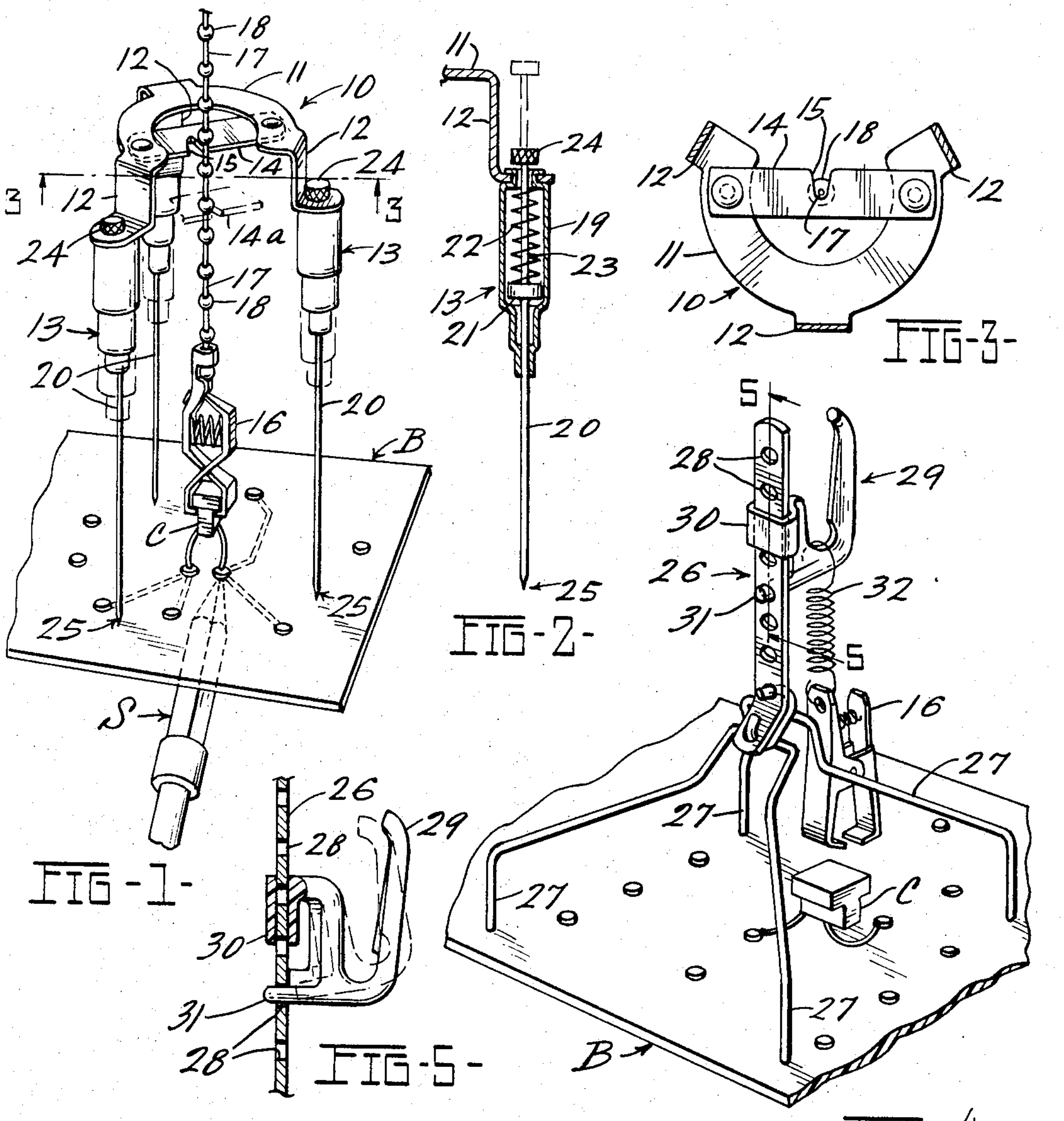
FIGURE 1 is a view in perspective of a first preferred embodiment of the invention, showing the tool positioned upon a small section of an electrical circuit board and attached to a component thereon.
FIGURE 2 is a cross-sectional view in elevation of one of the support legs for the tool shown in FIGURE 1, showing the detail of the spring mechanism mounted therein.
FIGURE 3 is a view taken along line 3—3 of FIGURE 1 and showing in detail the manner in which the component gripping member is attached to the spring mounted platform shown in FIGURE 1.
FIGURE 4 is a view in perspective of another preferred embodiment of this invention, showing this embodiment positioned on a small section of a circuit board with its component gripping member in position over a component to be removed from the circuit board.
Figure 6:
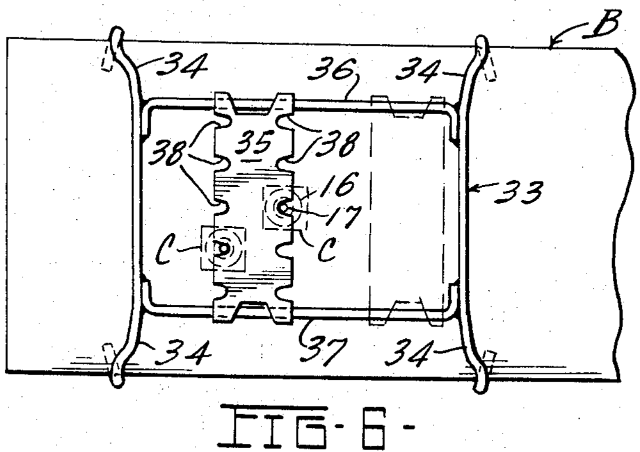

FIGURE 5 is a cross-sectional view, on an enlarged scale, taken along line 5—5 of FIGURE 4 and showing the detail of a releasable positioning and stop means for adjustably positioning the component gripping member at various heights above the component to be removed; and FIGURE 6 is a plan view of still another preferred embodiment of the invention, showing an adjustable platform frame slidingly associated with a small circuit board of corresponding size and showing a support platform for the gripping member supported by the frame.

Referring first to FIGURE 1, a section of an electrical circuit board B is shown with a tripod or leg supported platform, generally indicated by reference numeral 10 positioned thereon. The platform 10 includes a generally horizontal, open annular plate 11 having three downwardly depending leg brackets 12. Attached to the end portion of the leg bracket 12 is a spring biased telescoping leg, generally indicated by reference numeral 13, the details of which are shown in FIGURE 2. A support bar 14 is secured to and extend across the central opening in the plate 11 and has a constricted notch or slot 15 therein. A gripping member or clamp 16 with its upper end secured to a beaded chain or line 17 is suspended between the legs 13 of the platform 10 from the slot 15 in the support bar 14. The nubs or beads 18 of the line 17 are larger than the smallest diameter of the slot 15 so that the clamp 16 and line 17 will be held in fixed position below the level of the support bar 14 and plate 11. In this preferred embodiment, the line 17 can be a flexible, beaded polyethylene strip, a metallic beaded chain, or any other suitable material having spaced apart projections or enlargements.

Referring to FIGURE 2, the leg 13 includes a spring housing 19 secured directly to the end of the leg bracket 12 and an elongate foot 20 which extends through the bottom portion of the housing 19 and terminates in an enlarged head portion or stop member 21. A spring 22 rests upon the upper surface of the stop member 21 and is confined, under slight compression, within the housing 19. An elongate guide 23 is secured to the stop member 21 and extends coaxially through the spring 22 upwardly through an opening in the housing 19 and terminates in a head 24 on the other side of the end of the leg bracket 12. The foot 20 and guide 23 may be a single, needle-like member with an annular stop member 21 secured at an intermediate position and the head 24 secured to the upper end. The lower end of the foot 20 preferably terminates in a sharp point 25 which, when placed upon the circuit board B, as shown in FIGURE 1, will be slightly embedded in the upper surface of the board and prevent sliding or other undesirable movement thereon.

Referring again to FIGURE 1, the tool previously described is used to assist the electronics technician in removing a component C from the circuit board B as follows. The platform 10 is positioned generally over the component C to be removed, with the feet 20 of the legs 13 positioned on the board B so as to not electrically or mechanically interfere with other components of the board B. This is easily done due to the fact that the feet 20 are relatively small and may be temporarily but firmly positioned on the board B because the point 25 on the feet 20 will slightly embed themselves into the board B with a small amount of force. The clamp 16 is placed upon the component C and the entire platform 10 is pushed downwardly against the springs 22 so that the support bar 14 is in the position indicated in FIGURE 1 at 14*a*. In this position, the operator inserts the line 17 into the slot 15 and releases the downward pressure upon the platform 10 so that the springs 22 exert tension on the line 17 and therefore an upward force upon the clamp 16 and the component C. The entire tool will now remain in position and the operator is free to use both hands for other operations or to work on the other side of the circuit board B. As is commonly the case, the leads from the component C extend through holes in the circuit board B and are soldered to other leads of other components on the lower side of the board B. With the tool in position as shown and described, the operator, from the other side of circuit board B, applies heat with a soldering iron S to the soldered junction containing the leads of the component C. Due to the upward force exerted by the tool upon the component C by the springs 22, the component C will be pulled free of the board as soon as the soldered joint has been sufficiently softened to release the leads of the component C.

The device previously described has several advantages in addition to those previously enumerated. Firstly, due to the continual upward force upon the component C, it is necessary only to raise the temperature of the joint holding the leads of the component C to a point where the joint is softened to release the leads of the component C which, as previously explained, are placed under tension. Therefore, other leads soldered in the same joint, which are not under tension, remain in place. Secondly, due to the fact that a minimum amount of heat is needed to release these leads, it is less likely that a component C or other nearby components will be damaged from excessive heat. Thirdly, as seen in FIGURE 1, the clamp 16, which is shaped to correspond to the external dimensions of the component C, acts as an external heat sink to carry away any excessive heat which might damage the component C.

Referring to FIGURES 4 and 5, this embodiment of the invention comprises a vertical slide member 26 which is secured to a plurality of support members 27 which are positioned upon a circuit board B in the manner similar to the positioning of the legs 13 in the embodiment of FIGURE 1. A plurality of spaced apart apertures 28 in the slide member 26 provide a means for vertically positioning a sliding arm or hook 29 which includes a sliding shoe 30 which receives the slide member 26 and a stop member or peg 31. As best seen in FIGURE 5, the entire hook 29, which preferably is of a resilient material such as polyethylene, can be pivoted counterclockwise, as shown in FIGURE 5, to the position where the peg 31 is not engaged with an aperture 28 in the slide member 26. In this position, the hook 29 is slid along the slide member 26 to a desired position and is then pivoted clockwise until the peg 31 is received in an aperture 28.

With the hook 29 positioned at the desired height above the circuit board B, as shown in FIGURE 4, a clamp 16 and its spring 32 are placed upon the hook 29. The clamp 16 is then brought downwardly and attached to the component C, which extends the spring 32 such that the resiliency of the spring exerts an upward force upon the component C. The operation of this embodiment is otherwise similar to that previously described with reference to the embodiment of FIGURES 1–3.

FIGURE 6 shows yet another preferred embodiment of this invention which may be used when a series of similar sized circuit boards B are to be tested or serviced. In this embodiment, a frame 33 is supported over the circuit board B by legs 34 which extend around or clamp upon the edges of the circuit board B as shown. A moveable table 35 is slidingly associated with a pair of parallel rails 36 and 37 which are a part of the frame 33. Each side of the table 35 has a series of spaced apart slots 38 which receive a beaded line 17 and a clamp 16 in the manner described with reference to FIGURE 1. In this embodiment of FIGURE 6, the clamp 16 may be positioned generally over any component C by sliding the table 35 along the rails 36 and 37 and by selecting the appropriate slot 38 in the table 35. In addition, the entire frame 33 may be positioned anywhere along the circuit board B by sliding the legs along the edges of the board B.

It will be apparent, in each of the described embodiments, through use if the appropriate bead 18 or aperture 28, which cooperates with the slot 15 or the peg 31 respectively, that the vertical position or height of the clamp 16 (when the springs 22 or 32 are not compressed or extended), may be selected to correspond with the vertical position or height of component C to be removed or in accordance with the desired spring force to be exerted upon the component when the clamp 16 is attached. This is desirable in that certain mechanically fragile components would not withstand a relatively large force which might be desirable in the removal of other types of components where it is important to use a minimum amount of heat to melt the soldered leads.

It will also be apparent that with any of the previously described embodiments, a number of differently shaped clamps 16 with their associated beaded lines 17 or springs 32 may be used with a single platform support. Therefore, any number of sizes and shapes of component gripping clamps 16 may be advantageously used with a single platform.

Various modifications of the above described preferred embodiments of the invention will be apparent to those skilled in the art and it is to be understood that such modifications can be made without departing from the scope and tenor of the accompanying claims.

I claim:

1. An apparatus for removing electrical components from a circuit board, comprising, in combination, a gripping member for releasable attachment to a component to be removed, a support platform including a plurality of telescoping support legs and spring means for urging said legs to their extended position, and means for attaching said gripping member to said support platform a predetermined distance above such component when said platform is supported on such circuit board generally above such component whereby, when said gripping member is attached to such component, said spring means will be compressed whereby said gripping means and such component attached thereto will be urged away from such circuit board.

2. The apparatus of claim 1 wherein said platform includes a laterally extending constricted slot and wherein said means for attaching said gripping member comprises an elongate member slideably received in said constricted slot of said platform and having a series of spaced apart stop members larger than the constricted portion of said slot whereby said gripping member may be adjustably positioned above such component.

3. The apparatus of claim 1 wherein said gripping member is a spring biased clamp for releasable attachment to the component to be removed.

4. The apparatus of claim 1 wherein each of said telescoping support legs includes an upper portion secured to said support platform and a lower portion slidably associated with said upper portion with the lowermost end of said lower portion being of substantially reduced diameter relative to said upper portion and terminating in a sharp point.

5. An apparatus for removing electrical components from a circuit board, comprising, in combination, a component-gripping member for releasable attachment to the component to be removed, a support platform including at least three telescoping support legs with resilient means urging said legs to their extended position, and means for adjustably positioning said component-gripping member below said support platform and generally above said component when said platform legs are supported on said circuit board whereby, when said gripping member is attached to said component and said resilient means are compressed, said component will be urged away from said circuit board.

References Cited

UNITED STATES PATENTS

| | | | |
|---|---|---|---|
| 2,723,443 | 11/1955 | McKibben | 29—205 |
| 2,906,013 | 9/1959 | Kass | 29—278 |
| 3,006,063 | 10/1961 | Linan | 29—205 |
| 3,010,191 | 11/1961 | McCullough | 29—205 |
| 3,110,956 | 11/1963 | Fischer | 29—203 |
| 3,130,484 | 4/1964 | Zdanis | 29—203 |

THOMAS H. EAGER, *Primary Examiner.*